(12) United States Patent
Bi et al.

(10) Patent No.: US 10,403,716 B2
(45) Date of Patent: Sep. 3, 2019

(54) TRENCH CONTACT RESISTANCE REDUCTION

(71) Applicant: INTERNATIONAL BUSINESS MACHINES CORPORATION, Armonk, NY (US)

(72) Inventors: Zhenxing Bi, Niskayuna, NY (US); Kangguo Cheng, Schenectady, NY (US); Juntao Li, Cohoes, NY (US); Peng Xu, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/443,154

(22) Filed: Feb. 27, 2017

(65) Prior Publication Data

US 2018/0082950 A1    Mar. 22, 2018

Related U.S. Application Data

(62) Division of application No. 15/268,025, filed on Sep. 16, 2016, now Pat. No. 10,217,707.

(51) Int. Cl.
| | |
|---|---|
| *H01L 23/528* | (2006.01) |
| *H01L 29/08* | (2006.01) |
| *H01L 21/768* | (2006.01) |
| *H01L 23/485* | (2006.01) |
| *H01L 29/45* | (2006.01) |

(52) U.S. Cl.
CPC .... *H01L 29/0847* (2013.01); *H01L 21/76816* (2013.01); *H01L 21/76897* (2013.01); *H01L 23/485* (2013.01); *H01L 23/5283* (2013.01); *H01L 29/456* (2013.01)

(58) Field of Classification Search
CPC ......... H01L 23/5283; H01L 21/76805; H01L 21/76846; H01L 21/76895; H01L 23/53266; H01L 23/535; H01L 29/0847
USPC ....................................... 257/383
See application file for complete search history.

(56) References Cited

U.S. PATENT DOCUMENTS

| | | | |
|---|---|---|---|
| 5,644,166 A | | 7/1997 | Honeycutt et al. |
| 6,025,620 A | * | 2/2000 | Kimura ................. H01L 27/105 |
| | | | 257/296 |
| 6,239,029 B1 | | 5/2001 | Honeycutt et al. |
| 6,331,486 B1 | | 12/2001 | Cabral, Jr. et al. |
| 6,383,857 B2 | * | 5/2002 | Terauchi ........... H01L 21/76897 |
| | | | 257/E21.507 |
| 6,753,606 B2 | | 6/2004 | Cabral, Jr. et al. |

(Continued)

OTHER PUBLICATIONS

List of IBM Patents or Patent Applications Treated as Related dated Feb. 27, 2017, 2 pages.

*Primary Examiner* — Ori Nadav
(74) *Attorney, Agent, or Firm* — Tutunjian & Bitetto, P.C.; Vazken Alexanian

(57) ABSTRACT

A method is presented for forming a semiconductor device. The method includes forming source/drain over a semiconductor substrate, forming a sacrificial layer over the source/drain, and forming an inter-level dielectric (ILD) layer over the sacrificial layer. The method further includes forming trenches that extend partially into the sacrificial layer, removing the sacrificial layer to expose an upper surface of the source/drain, and filling the trenches with at least one conducting material. The sacrificial layer is germanium (Ge) and the at least one conducting material includes three conducting materials.

8 Claims, 8 Drawing Sheets

(56) References Cited

U.S. PATENT DOCUMENTS

| | | | |
|---|---|---|---|
| 7,102,234 B2 | 9/2006 | Cabral, Jr. et al. | |
| 7,598,572 B2* | 10/2009 | Dyer | H01L 21/28123 257/365 |
| 7,659,160 B2* | 2/2010 | Belyansky | H01L 21/76804 257/288 |
| 7,851,291 B2 | 12/2010 | Shifren et al. | |
| 7,879,675 B2* | 2/2011 | Radosavljevic | H01L 23/485 257/E21.425 |
| 8,361,859 B2* | 1/2013 | Adam | H01L 21/28525 438/233 |
| 8,853,862 B2 | 10/2014 | Alptekin et al. | |
| 8,865,556 B2* | 10/2014 | Newbury | H01L 21/28518 257/347 |
| 8,975,708 B2 | 3/2015 | Toh et al. | |
| 8,994,104 B2 | 3/2015 | Glass et al. | |
| 9,059,024 B2 | 6/2015 | Glass et al. | |
| 9,070,617 B2 | 6/2015 | Kim et al. | |
| 9,117,791 B2 | 8/2015 | Glass et al. | |
| 9,224,735 B2 | 12/2015 | Glass et al. | |
| 9,349,810 B2 | 5/2016 | Glass et al. | |
| 2006/0270133 A1* | 11/2006 | Yasutake | H01L 21/82380 438/197 |
| 2007/0093055 A1* | 4/2007 | Chou | H01L 21/02063 438/638 |
| 2007/0187767 A1* | 8/2007 | Yasutake | H01L 21/28518 257/368 |
| 2009/0050972 A1* | 2/2009 | Lindsay | H01L 21/82380 257/368 |
| 2009/0325350 A1* | 12/2009 | Radosavljevic | H01L 23/485 438/163 |
| 2011/0084320 A1* | 4/2011 | Jung | H01L 21/28512 257/288 |
| 2012/0037998 A1* | 2/2012 | Bedell | H01L 21/82380 257/369 |
| 2013/0214362 A1* | 8/2013 | Nemouchi | H01L 21/8238 257/369 |
| 2014/0377917 A1* | 12/2014 | He | H01L 27/0886 438/157 |
| 2015/0333180 A1 | 11/2015 | Glass et al. | |
| 2016/0118384 A1 | 4/2016 | Glass et al. | |

* cited by examiner

TRENCH CONTACT RESISTANCE REDUCTION

BACKGROUND

Technical Field

The present invention relates generally to semiconductor devices, and more specifically, to trench contact resistance reduction in semiconductor devices.

Description of the Related Art

Semiconductor device performance is dependent upon numerous factors, one being the total device resistance. The total device resistance is, in turn, a function of parameters such as contact resistance, wiring resistance, channel resistance, etc. Decreasing the total device resistance can improve device performance (i.e., improve device speed).

High contact resistance results in loss of performance, errors in data and increased heat and power loss, to name a few effects. Contact resistance in semiconductor devices increases dramatically with reduction in pitch scaling sizes. Smaller contact areas result in rapid increases in contact resistance. With nanometer scale structures, such as fins for fin field effect transistors, smaller three-dimensional structures present particular difficulties in forming suitable contact areas to make adequate electrical contact.

SUMMARY

In accordance with an embodiment, a method is provided for forming a semiconductor device. The method includes forming source/drain over a semiconductor substrate, forming a sacrificial layer over the source/drain, forming an inter-level dielectric (ILD) layer over the sacrificial layer, forming trenches that extend partially into the sacrificial layer, removing the sacrificial layer to expose an upper surface of the source/drain, and filling the trenches with at least one conducting material.

In accordance with another embodiment, a semiconductor device is provided. The semiconductor device includes source/drain formed over a semiconductor substrate, a sacrificial layer formed over the source/drain, an inter-level dielectric (ILD) layer formed over the sacrificial layer, and trenches that extend partially into the sacrificial layer. The sacrificial layer is removed to expose an upper surface of the source/drain. The trenches are filled with at least one conducting material.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The invention will provide details in the following description of preferred embodiments with reference to the following figures wherein.

Throughout the drawings, same or similar reference numerals represent the same or similar elements.

DETAILED DESCRIPTION

Figure 1:
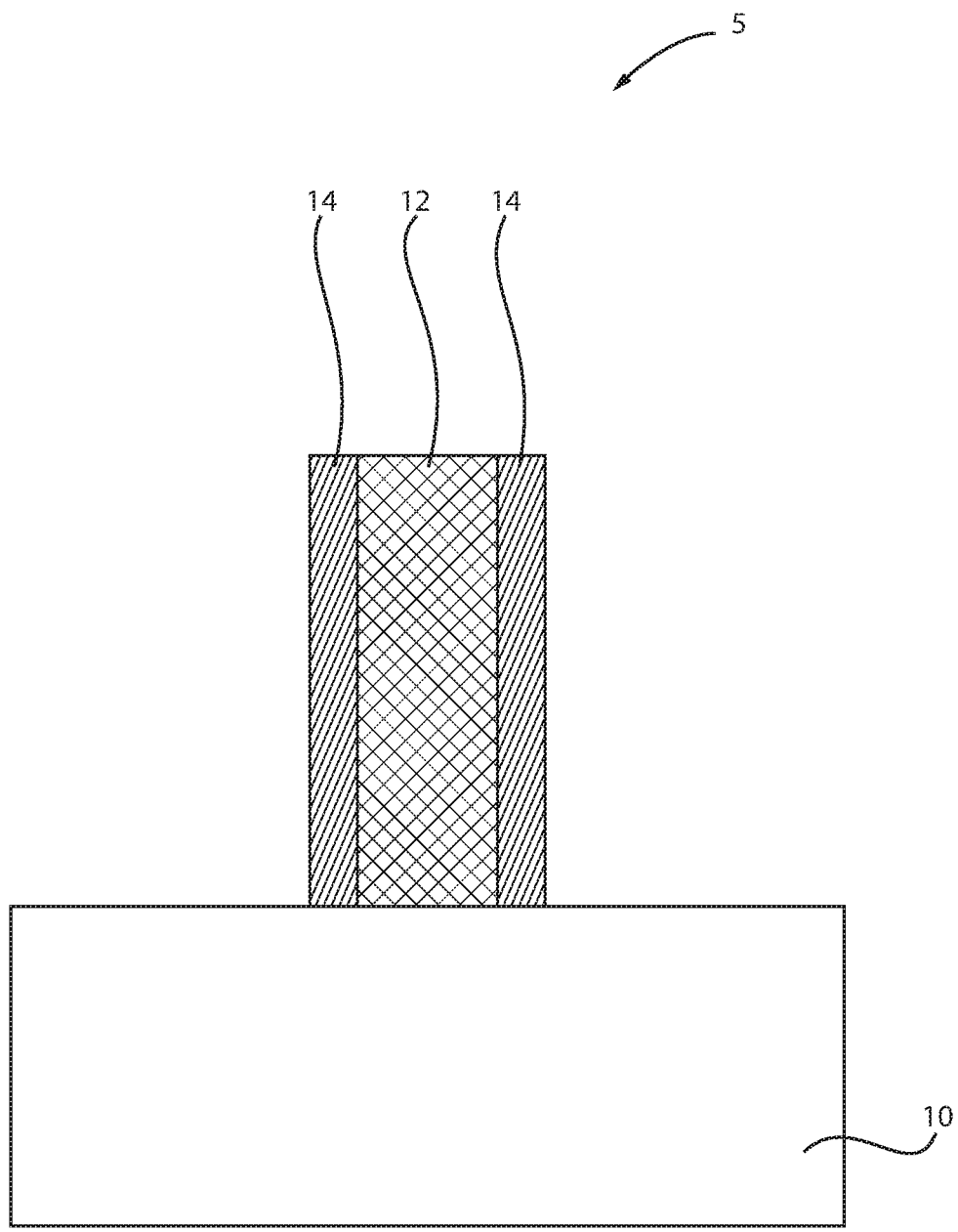
FIG. 1 is a cross-sectional view of a semiconductor device including a gate structure with spacers formed on adjacent portions thereof, in accordance with an embodiment of the present invention.

Embodiments of the present invention relate generally to the formation of a semiconductor device. The formation includes a method of forming source/drain over a semiconductor substrate, forming a sacrificial layer over the source/drain, forming an inter-level dielectric (ILD) layer over the sacrificial layer, forming trenches that extend partially into the sacrificial layer, removing the sacrificial layer to expose an upper surface of the source/drain, and filling the trenches with at least one conducting material.

Moreover, embodiments of the present invention relate generally to a semiconductor device. The semiconductor device includes source/drain formed over a semiconductor substrate, a sacrificial layer formed over the source/drain, an inter-level dielectric (ILD) layer formed over the sacrificial layer, and trenches that extend partially into the sacrificial layer. The sacrificial layer is removed to expose an upper surface of the source/drain. The trenches are filled with at least one conducting material.

In one or more embodiments, a method and structure is presented for improving the trench contact by epitaxially growing a sacrificial layer (e.g., Ge) on top of the epitaxy source/drain (S/D). The sacrificial Ge layer takes all the beat during contact trench RIE (reactive ion etching) and protects the underlying S/D. The sacrificial Ge layer is then removed during the pre-clean of the trench metallization so that (1) one or more conducting materials can be formed on top of the pristine highly-doped S/D epi surface to reduce the contact barrier and (2) removing sacrificial Ge results in the exposure of the entire S/D so that the one or more conducting materials can cover the entire S/D to increase the contact area. Both (1) and (2) reduces contact resistance.

In one or more embodiments, a sacrificial Ge layer is used to protect the source/drain epitaxy and obtain a fresh interface between contact conducting material (e.g., a metal) and source/drain epitaxy to reduce contact resistance. Removing the sacrificial Ge layer creates a unique inverted-T shape contact with reduced contact resistance.

As used herein, "semiconductor device" refers to an intrinsic semiconductor material that has been doped, that is, into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentration in an extrinsic semiconductor determines the conductivity type of the semiconductor.

A "gate structure" means a structure used to control output current (i.e., flow of carriers in the channel) of a semiconducting device through electrical or magnetic fields. The gate structure can include one or multiple layers. For example, the gate structure can include a doped semiconductor for a junction field effect transistor. Alternatively, the gate structure can include a gate dielectric and a gate conductor.

As used herein, the term "drain" means a doped region in the semiconductor device located at the end of the channel, in which carriers are flowing out of the transistor through the drain.

As used herein, the term "source" is a doped region in the semiconductor device, in which majority carriers are flowing into the channel.

The term "direct contact" or "directly on" means that a first element, such as a first structure, and a second element, such as a second structure, are connected without any intermediary conducting, insulating or semiconductor layers at the interface of the two elements.

The terms "over", "overlying", "atop", "positioned on" or "positioned atop" means that a first element, such as a first structure, is present on a second element, such as a second structure, wherein intervening elements, such as an interface structure can be present between the first element and the second element.

The term "electrically connected" means either directly electrically connected, or indirectly electrically connected, such that intervening elements are present; in an indirect electrical connection, the intervening elements can include inductors and/or transformers.

The term "crystalline material" means any material that is single-crystalline, multi-crystalline, or polycrystalline.

The term "non-crystalline material" means any material that is not crystalline; including any material that is amorphous, nano-crystalline, or micro-crystalline.

As used herein, "p-type" refers to the addition of impurities to an intrinsic semiconductor that creates deficiencies of valence electrons. In a silicon-containing substrate, examples of p-type dopants, i.e., impurities, include but are not limited to: boron, aluminum, gallium and indium.

As used herein, "n-type" refers to the addition of impurities that contributes free electrons to an intrinsic semiconductor. In a silicon containing substrate examples of n-type dopants, i.e., impurities, include but are not limited to antimony, arsenic and phosphorous.

As used herein, an "anisotropic etch process" denotes a material removal process in which the etch rate in the direction normal to the surface to be etched is greater than in the direction parallel to the surface to be etched. The anisotropic etch can include reactive-ion etching (RIE). Other examples of anisotropic etching that can be used include ion beam etching, plasma etching or laser ablation.

As used herein, "sputtering" means a method of depositing a film of material on a semiconductor surface. A target of the desired material, i.e., source, is bombarded with particles, e.g., ions, which knock atoms from the target, and the dislodged target material deposits on the deposition surface. Examples of sputtering techniques include, but are not limited to, DC diode sputtering ("also referred to as DC sputtering"), radio frequency (RF) sputtering, magnetron sputtering, and ionized metal plasma (IMP) sputtering.

It is to be understood that the present invention will be described in terms of a given illustrative architecture; however, other architectures, structures, substrate materials and process features and steps/blocks can be varied within the scope of the present invention. It should be noted that certain features may not be shown in all figures for the sake of clarity. This is not intended to be interpreted as a limitation of any particular embodiment, or illustration, or scope of the claims.

FIG. 1 is a cross-sectional view of a semiconductor device including a gate structure with spacers formed on adjacent portions thereof, in accordance with an embodiment of the present invention.

A semiconductor device 5 includes a semiconductor substrate 10 with a gate structure 12 formed on the surface region of the semiconductor substrate 10. The gate structure 12 includes spacers 14 formed on opposed ends thereof.

In one or more embodiments, the substrate 10 can be a semiconductor or an insulator with an active surface semiconductor layer. The substrate 10 can be crystalline, semi-crystalline, microcrystalline, or amorphous. The substrate 10 can be essentially (i.e., except for contaminants) a single element (e.g., silicon), primarily (i.e., with doping) of a single element, for example, silicon (Si) or germanium (Ge), or the substrate 10 can include a compound, for example, $Al_2O_3$, $SiO_2$, GaAs, SiC, or SiGe. The substrate 10 can also have multiple material layers, for example, a semiconductor-on-insulator substrate (SeOI), a silicon-on-insulator substrate (SOI), germanium-on-insulator substrate (GeOI), or silicon-germanium-on-insulator substrate (SGOI). The substrate 10 can also have other layers forming the substrate 10, including high-k oxides and/or nitrides. The substrate 10 can also have other structures such as trench isolation (not shown). In one or more embodiments, the substrate 10 can be a silicon wafer. In an embodiment, the substrate 10 is a single crystal silicon wafer.

The substrate 10 can be etched by reactive ion etching (RIE) to provide a directional etch with control of sidewall etching. In various embodiments, the substrate 10 can be etched using a dry plasma etch. The substrate 10 can have, e.g., fins, vertical nanowires, horizontal nanowires, nanosheets, or any other suitable device structures.

The gate structure 12 is formed directly on the semiconductor substrate 10, in accordance with one embodiment of the present invention. The gate structure 12 can be formed using deposition, photolithography and a selective etching process. Specifically, a pattern is produced by applying a photoresist to the surface to be etched; exposing the photoresist to a pattern of radiation; and then developing the pattern into the photoresist utilizing a resist developer. Once the patterning of the photoresist is completed, the sections covered by the photoresist are protected while the exposed regions are removed using a selective etching process that removes the unprotected regions.

In one embodiment, a hard mask can be used to form the gate structure 12. The hard mask can be formed by first depositing a dielectric hard mask material, such as SiN or SiO$_2$, atop a layer of gate electrode material and then applying a photoresist pattern to the hard mask material using a lithography process. The photoresist pattern is then transferred into the hard mask material using a dry etch process forming the hard mask. Next the photoresist pattern is removed and the hard mask pattern is then transferred into the gate electrode material during a selective etching process. The hard mask can be removed by a wet or dry etch prior to the silicidation process.

The gate structure 12 can include at least a gate conductor atop a gate dielectric (not shown). The gate conductor can be a metal gate electrode. The metal gate electrode can be any conductive metal including, but not limited to W, Ni, Ti, Mo, Ta, Cu, Pt, Ag, Au, Ru, Ir, Rh, and Re, and alloys that include at least one of the aforementioned conductive elemental metals. The gate structure can further include a second conductive material (not shown) atop the metal gate electrode. In one example, the second conductive material can be a doped semiconductor material, such as a doped silicon containing material, e.g., doped polysilicon.

The conducting material can be, e.g., polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material can further comprise dopants that are incorporated during or after deposition.

The gate can include a workfunction tuning layer to set the threshold voltage of the transistor. The work function layer may be a nitride, including but not limited to titanium nitride (TiN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC) titanium aluminum carbide (TiAlC), tantalum carbide (TaC), hafnium carbide (HfC), and combinations thereof.

In some embodiments, the gate structure can include a doped semiconductor such as a p-type doped polysilicon, which forms a pn junction between the gate and the channel. Such a device is a junction field effect transistor (JFET). In JFET, there is no gate dielectric. In other embodiments (e.g., MOSFET), the gate has both gate dielectric and gate conductor.

The gate structure 12 functions to switch the semiconductor device from an "on" to "off" state, and vice versa.

The gate material of the gate structure 12 can be any of copper (Cu), gold (Au), tungsten (W), titanium (Ti), tantalum (Ta), platinum (Pt), nickel (Ni), cobalt (Co), rhodium (Rh), ruthenium (Ru), palladium (Pd), hafnium (Hf), zirconium (Zr), or aluminum (Al), or combinations thereof, metal nitrides such as titanium nitride (TiN), tungsten nitride (WN), or tantalum nitride (TaN), or combinations thereof, metal silicide such as titanium silicide (TiSi), tungsten silicide (WSi), tantalum silicide (TaSi), cobalt silicide (CoSi), platinum silicide (PtSi), nickel silicide (NiSi), or combinations thereof, metal silicon nitride such as titanium silicon nitride (TiSiN), or tantalum silicon nitride (TaSiN), or combinations thereof, metal carbide such as titanium carbide (TiC), zirconium carbide (ZrC), tantalum carbide (TaC), hafnium carbide (HfC), or aluminum carbide (AlC), or combinations thereof, or metal carbon nitride such as tantalum carbon nitride (TaCN), titanium carbon nitride (TiCN), or combinations thereof. Other suitable materials can be used in other embodiments such as conductive metal oxides (e.g., ruthenium oxide).

The spacers 14 can be formed by deposition followed by a directional etch (e.g., RIE). Spacers 14 can be formed along the sidewalls of the gate structure 12. For example, spacer material such as a nitride (e.g., Si$_3$N$_4$) can be deposited in a conventional manner, such as by chemical vapor deposition (CVD) using a silane source. Other techniques, which can be suitable for deposition of a nitride layer, include low-pressure CVD (LPCVD) and atmospheric pressure (CVD) (APCVD). Portions of the deposited nitride layer are subsequently etched away in a conventional manner to form the spacers 14. Spacer material can be silicon oxide, silicon oxynitride, silicon nitride, SiBCN, SiOCN, SiOC, or any suitable combination of those materials.

In various embodiments, the materials and layers can be deposited by physical vapor deposition (PVD), chemical vapor deposition (CVD), atomic layer deposition (ALD), molecular beam epitaxy (MBE), or any of the various modifications thereof, for example plasma-enhanced chemical vapor deposition (PECVD), metal-organic chemical vapor deposition (MOCVD), low pressure chemical vapor deposition (LPCVD), electron-beam physical vapor deposition (EB-PVD), and plasma-enhanced atomic layer deposition (PE-ALD). The depositions can be epitaxial processes, and the deposited material can be crystalline. In various embodiments, formation of a layer can be by one or more deposition processes, where, for example, a conformal layer can be formed by a first process (e.g., ALD, PE-ALD, etc.) and a fill can be formed by a second process (e.g., CVD, electrodeposition, PVD, etc.).

Figure 2:
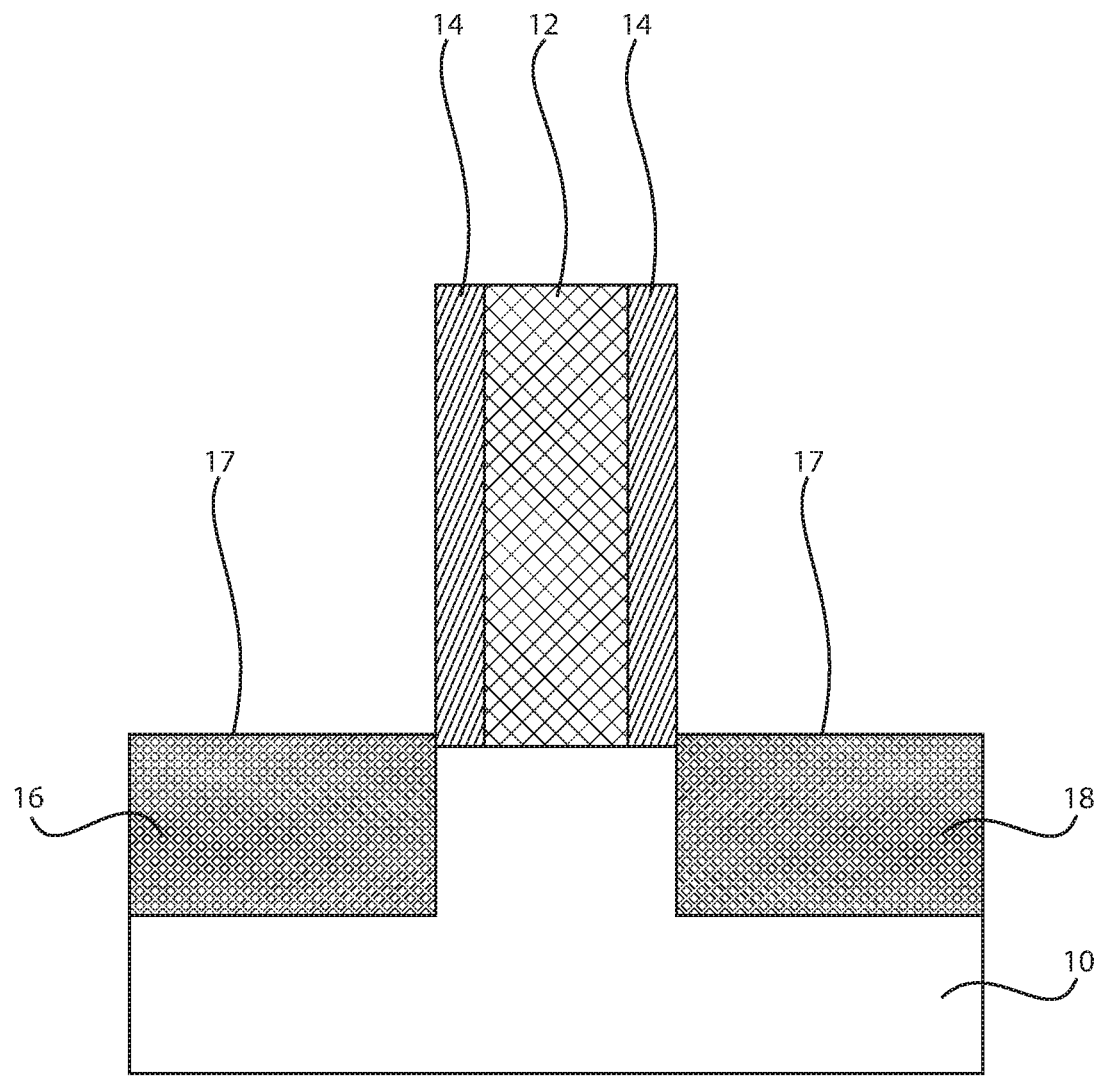
FIG. 2 is a cross-sectional view of the semiconductor device of FIG. 1 where source/drain are epitaxially grown over a semiconductor substrate, in accordance with an embodiment of the present invention.

FIG. 2 is a cross-sectional view of the semiconductor device of FIG. 1 where source/drain are epitaxially grown over a semiconductor substrate, in accordance with an embodiment of the present invention. The source/drain 16, 18 can also be formed by implanting dopants into the substrate 10.

In various embodiments, in-situ doped source/drain 16, 18 are deposited or formed via epitaxial growth. Alternatively, dopants or additional dopants can be incorporated in the epitaxy layer after epitaxy. Dopant techniques include, but are not limited to, ion implantation, gas phase doping, plasma doping, plasma immersion ion implantation, cluster doping, infusion doping, liquid phase doping, solid phase doping, etc.

The doped regions 16, 18 can be formed within portions of the semiconductor substrate 10. The dopant can be provided to the doped region(s) 16, 18 (i.e., source/drain region(s)) by ion implantation, and source/drains formed by annealing the doped region(s) 16, 18. In various embodiments, the doped regions 16, 18 can be n-doped or p-doped. The doped regions 16, 18 can form a bottom source/drain.

In various embodiments, the bottom source can be doped in-situ or ex-situ, for example, through ion implantation or thermal diffusion of dopants into the semiconductor substrate 10. The dopant of the source can be activated by annealing. Other suitable doping techniques can also be used, including but not limited to, gas phase doping, plasma doping, plasma immersion ion implantation, cluster doping, infusion doping, liquid phase doping, solid phase doping, or combinations thereof.

Forming the source and drain regions 16, 18 can include forming an in situ doped epitaxial semiconductor material on the source and drain region portions of the semiconductor substrate 10. The term "epitaxial semiconductor material" denotes a semiconductor material that has been formed using an epitaxial deposition or growth process. "Epitaxial growth and/or deposition" means the growth of a semiconductor material on a deposition surface of a semiconductor material, in which the semiconductor material being grown has substantially the same crystalline characteristics as the semiconductor material of the deposition surface. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation. In some embodiments, the epitaxial deposition process is a selective deposition method, in which the epitaxial semiconductor material is formed only on semiconductor material deposition surfaces. The epitaxial deposition process will not form epitaxial semiconductor material on dielectric surfaces.

In some embodiments, the epitaxial semiconductor material that provides the source and drain regions 16, 18 can be composed of silicon (Si), germanium (Ge), silicon germanium (SiGe), silicon doped with carbon (Si:C) or a combination thereof. In one example, the p-type source and drain regions are provided by silicon germanium (SiGe) epitaxial semiconductor material. In one embodiment, a number of different sources can be used for the epitaxial deposition of the epitaxial semiconductor material that provides the source and drain regions 16, 18.

Examples of silicon including source gasses can include silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. Examples of germanium including source gasses for epitaxially forming the epitaxial semiconductor material of a germanium containing semiconductor include germane, digermane, halogermane, dichlorogermane, trichlorogermane, tetrachlorogermane and combinations thereof.

Epitaxial deposition can be carried out in a chemical vapor deposition apparatus, such as a metal organic chemical vapor deposition (MOCVD) apparatus or a plasma enhanced chemical vapor deposition (PECVD) apparatus. The temperature for epitaxial deposition typically ranges from 550° C. to 900° C. Although higher temperature typically results in faster deposition, the faster deposition can result in crystal defects and film cracking.

The epitaxial semiconductor material that provides the source and drain regions 16, 18 can be in situ doped to a p-type conductivity or an n-type conductivity. The term "in situ" denotes that a dopant, e.g., n-type or p-type dopant, is introduced to the base semiconductor material, e.g., silicon or silicon germanium, during the formation of the base material. For example, an in situ doped epitaxial semiconductor material can introduce p-type dopants to the material being formed during the epitaxial deposition process that includes p-type source gasses.

As used herein, "p-type" refers to the addition of impurities to an intrinsic semiconductor that creates deficiencies of valence electrons. In a type IV semiconductor, such as silicon, examples of p-type dopants, i.e., impurities, include but are not limited to, boron, aluminum, gallium and indium. The p-type gas dopant source can include diborane ($B_2H_6$).

As used herein, "n-type" refers to the addition of impurities that contributes free electrons to an intrinsic semiconductor. In a type IV semiconductor, such as silicon, examples of n-type dopants, i.e., impurities, include but are not limited to antimony, arsenic and phosphorous.

Figure 3:
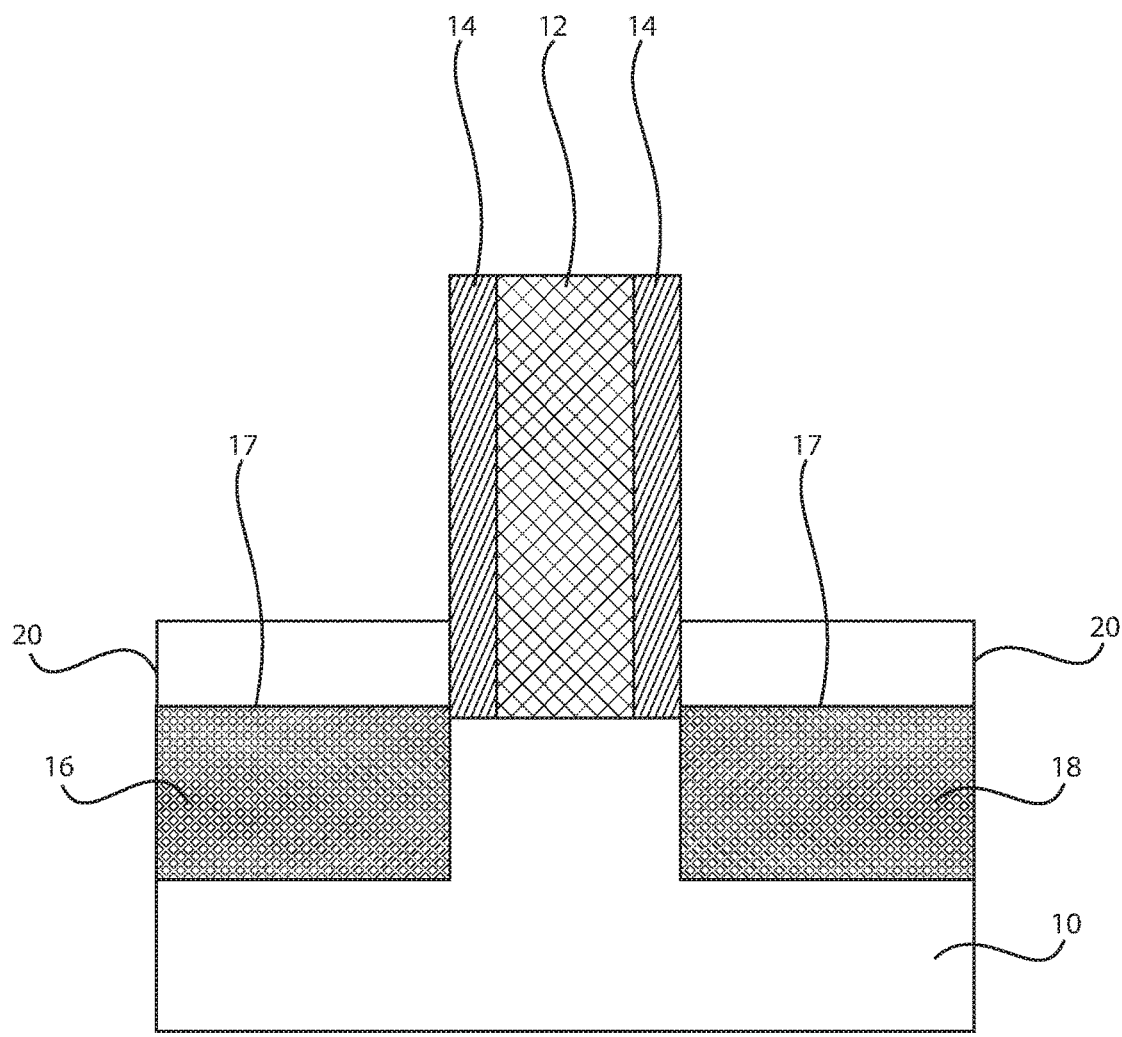
FIG. 3 is a cross-sectional view of the semiconductor device of FIG. 2 where a sacrificial material is formed over the source/drain, in accordance with an embodiment of the present invention.

FIG. 3 is a cross-sectional view of the semiconductor device of FIG. 2 where a sacrificial material is formed over the source/drain, in accordance with an embodiment of the present invention.

In various embodiments, a sacrificial layer 20 is deposited over the source/drain 16, 18. The sacrificial layer 20 can be epitaxially grown. In one example, the sacrificial layer 20 is germanium (Ge). In another example, the sacrificial layer 20 is high Ge % SiGe. The epitaxy of the sacrificial layer 20 and the source/drain 16, 18 can be integrated in the same epitaxy process. As a result, a top surface 17 of the source/drain 16, 18 remains contamination-free.

Figure 4:
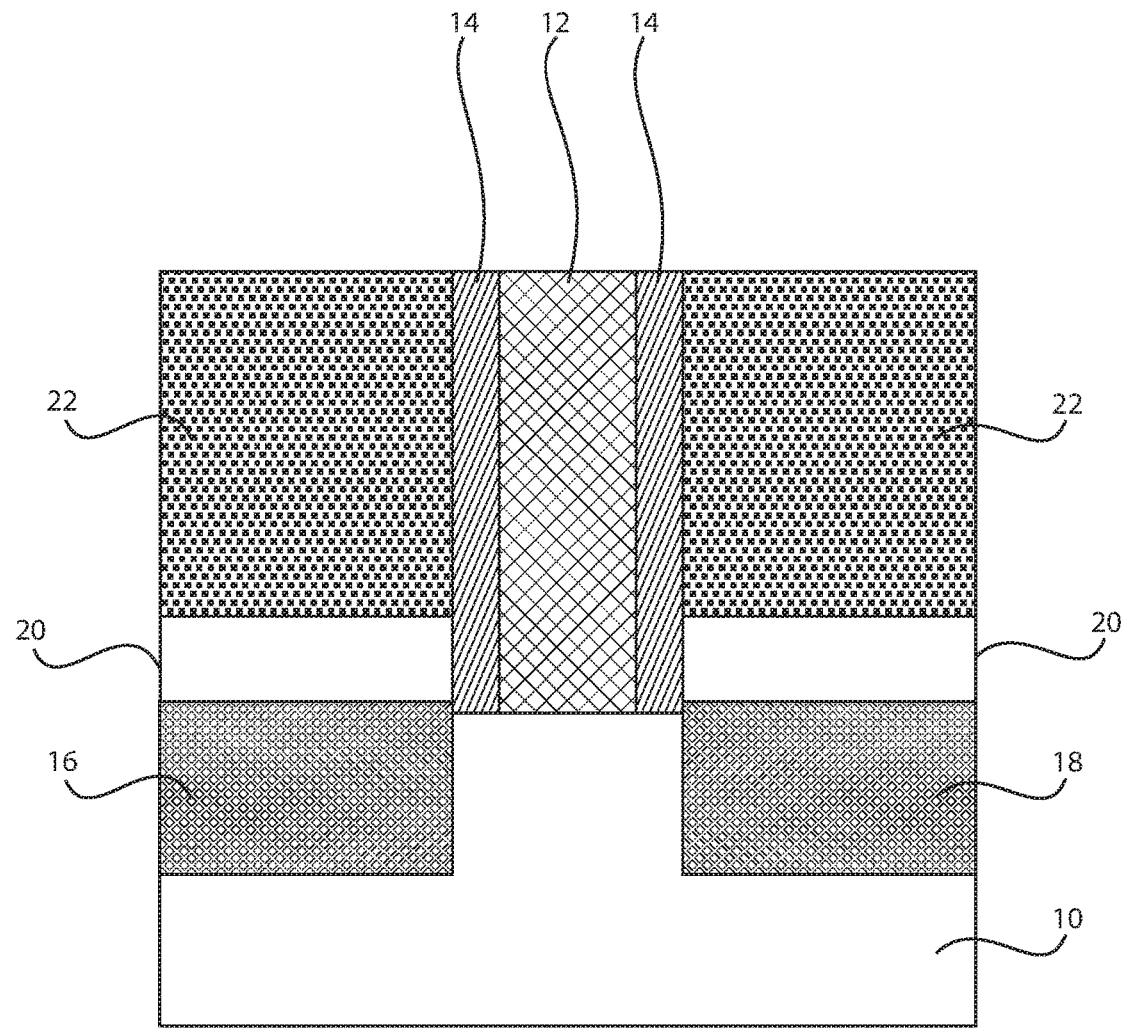
FIG. 4 is a cross-sectional view of the semiconductor device of FIG. 3 where an inter-level dielectric (ILD) layer is formed over the sacrificial material, in accordance with an embodiment of the present invention.

FIG. 4 is a cross-sectional view of the semiconductor device of FIG. 3 where an inter-level dielectric layer is formed over the sacrificial material, in accordance with an embodiment of the present invention.

In various embodiments, an inter-level dielectric (ILD) oxide fill takes place. The ILD oxide 22 is planarized. The ILD oxide 22 fills the space or region above the sacrificial layer 20. The ILD oxide 22 extends up to a top surface of the gate structure 12, such that the ILD oxide 22 is flush with the gate structure 12. The height of the ILD oxide 22 is less than the height of the gate structure 12. The width of the ILD oxide 22 is greater than the width of the gate structure 12. The width of the ILD oxide 22 is approximately equal to or substantially equal to the width of the sacrificial layer 20 and the source/drain 16, 18. In some embodiments, a liner (not shown) can be deposited before the deposition of ILD oxide 22.

In various embodiments, the height of the ILD oxide fill 22 can be reduced by chemical-mechanical polishing (CMP) and/or etching. Therefore, the planarization process can be provided by CMP. Other planarization process can include grinding and polishing.

In one or more embodiments, the ILD oxide 22 can have a thickness in the range of about 30 nm to about 150 nm, or in the range of about 30 nm to about 50 nm. In one example embodiment, the ILD oxide 22 has a thickness greater than the thickness of the sacrificial layer 20.

The ILD 22 can be selected from the group consisting of silicon containing materials such as $SiO_2$, $Si_3N_4$, $SiO_xN_y$, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC), also known as amorphous hydrogenated carbon, α-C:H). Additional choices for the ILD 22 include any of the aforementioned materials in porous form, or in a form that changes during processing to or from being porous and/or permeable to being non-porous and/or non-permeable.

Figure 5:
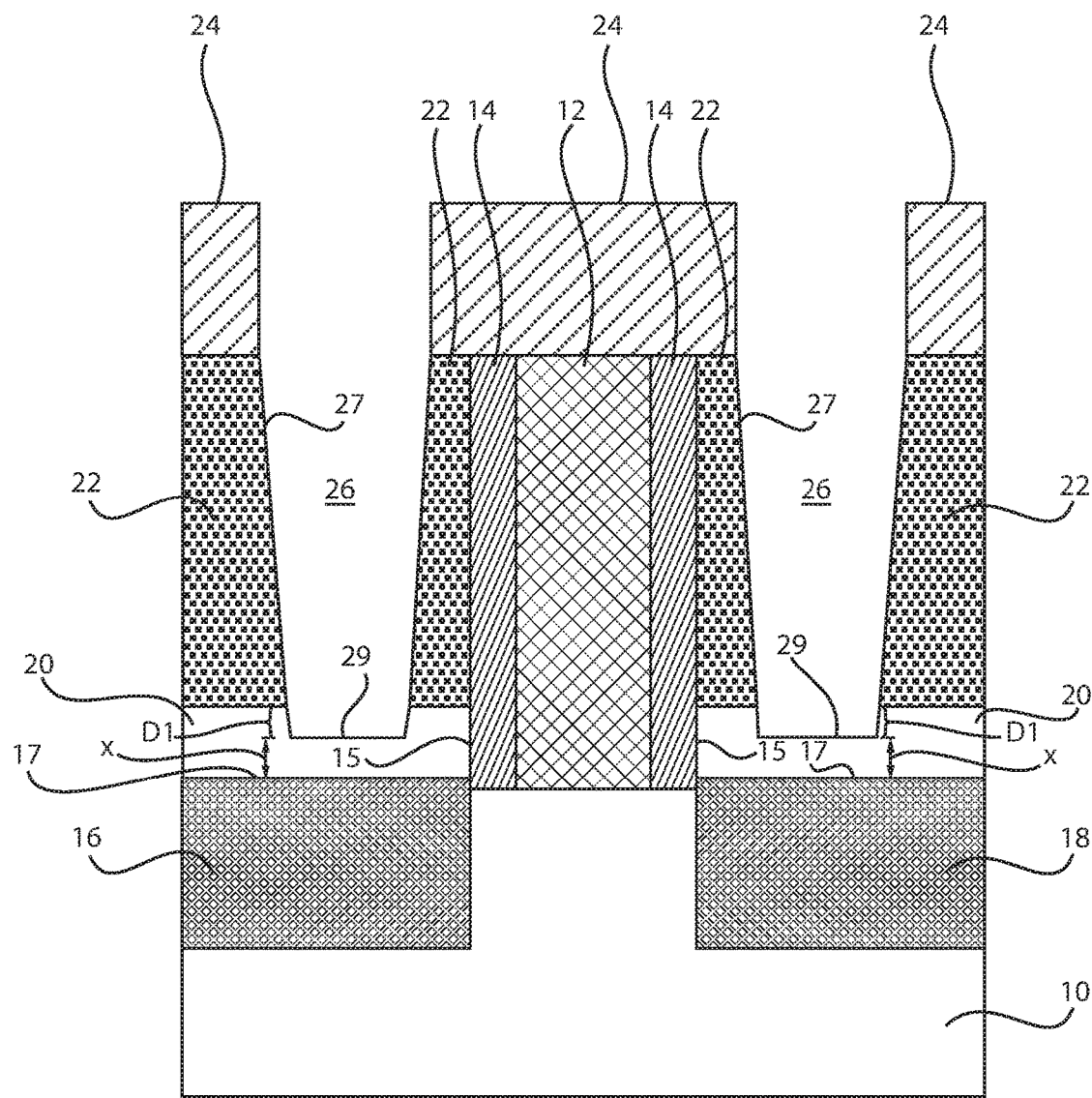
FIG. 5 is a cross-sectional view of the semiconductor device of FIG. 4 where trenches are formed that extend partially into the sacrificial layer, in accordance with an embodiment of the present invention.

FIG. 5 is a cross-sectional view of the semiconductor device of FIG. 4 where trenches are formed that extend partially into the sacrificial layer, in accordance with an embodiment of the present invention.

A first trench 26 is formed on one side of the gate structure 12 and a second trench 26 is formed on the other side of the gate structure 12. The trenches 26 can have inclined inner walls 27. A mask 24 can also be deposited on the non-trenched portions of the ILD 22 and the top portion of the gate structure 12. Masking is used to protect one area of the wafer while working on another. This process is referred to as photolithography or photo-masking.

The trench 26 can be formed to extend not only through the ILD layer 22, but also through a portion of the sacrificial layer 20 near the top of the doped (source/drain) regions 16, 18. The trench 26 can extend a distance D1 into the sacrificial layer 20. The trench 26 extends through the sacrificial layer 20 to subsequently expose the top surface 17 of the doped (source/drain) regions 16, 18. The trench 26 can be formed using a reactive ion etch (RIE) process. The doped (source/drain) regions 16, 18 remain intact during the RIE (i.e., no damage to regions 16, 18 and no dopant loss). Thus, the sacrificial layer 20 takes all the beat of the RIE. The distance between the trench tip 29 and the top surface 17 of the source/drain 16, 18 can be designated as "X." In one example embodiment, the trenches 26 run transversely to a longitudinal axis of the gate structure 12.

In general, at least one dielectric isolation region is typically provided in the semiconductor substrate 10 to isolate the adjacent device regions from each other. The dielectric isolation region can be a trench isolation region or a field oxide isolation region. The trench isolation region is formed utilizing a conventional trench isolation process well known to those skilled in the art. For example, lithography, etching and filling of the trench with a trench dielectric can be used in forming the trench isolation region. Optionally, a liner can be formed in the trench prior to trench fill, a densification step can be performed after the trench fill and a planarization process can follow the trench fill as well. The field oxide can be formed utilizing a so-called local oxidation of silicon process.

The shallow trench isolation (STI) regions are formed by etching a trench in the substrate utilizing a conventional dry etching process such as RIE or plasma etching. The trenches can optionally be lined with a conventional liner material, e.g., an oxide, and then CVD or another like deposition process is used to fill the trench with polysilicon or another like STI dielectric material. The STI dielectric can optionally be densified after deposition. A conventional planarization process such as chemical-mechanical polishing (CMP) can optionally be used to provide a planar structure.

RIE is a form of plasma etching in which during etching the surface to be etched is placed on the RF powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used include ion beam etching, plasma etching or laser ablation.

In another embodiment, the sacrificial layer 20 can be recessed using a selective etch process. In some embodiments, the sacrificial layer 20 is removed by an etch that is selective to the ILD 22. The etch process for recessing the sacrificial layer 20 can be an anisotropic etch or an isotropic etch. In some examples, the etch process can be a wet chemical etch, RIE, plasma etch, laser etch and combinations thereof.

Figure 6:
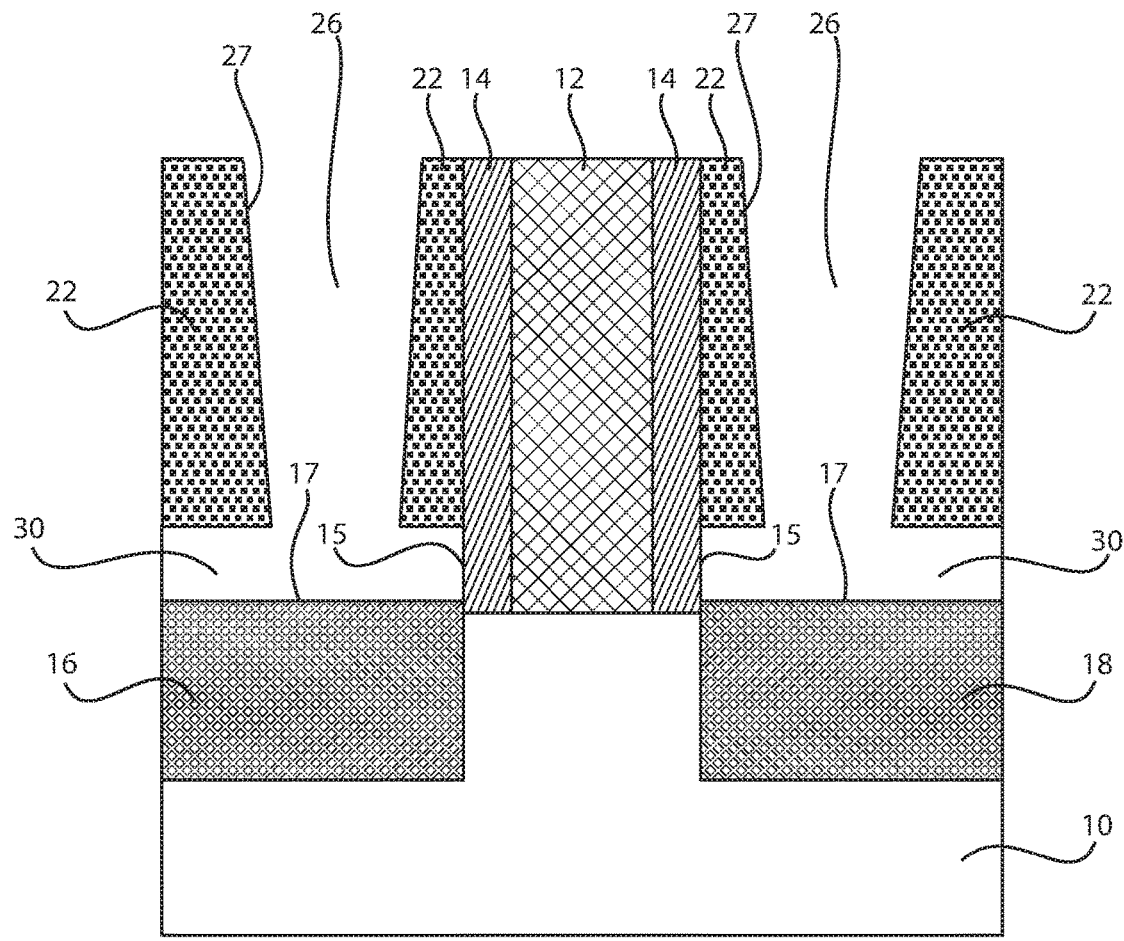
FIG. 6 is a cross-sectional view of the semiconductor device of FIG. 5 where the sacrificial layer is removed, in accordance with an embodiment of the present invention.

FIG. 6 is a cross-sectional view of the semiconductor device of FIG. 5 where the sacrificial layer is removed, in accordance with an embodiment of the present invention.

The mask 24 of FIG. 5 is stripped and the sacrificial layer 20 is selectively removed to expose the source/drain 16, 18. In fact, the entire top surface 17 of the source/drain 16, 18 is exposed. This step serves as the pre-clean step before conducting material deposition takes place in order to reveal the entire epi source/drain. Furthermore, the epi source/drain surface is pristine. The gap region 30 extends across an entire top or upper surface 17 of the source/drain 16, 18 up to a lower sidewall 15 of the spacers 14. The gap region 30 in combination with the trench 26 creates an inverted T-shape region for receiving conducting material deposition (FIG. 7).

As used herein, the term "selective" in reference to a material removal process denotes that the rate of material removal for a first material is greater than the rate of removal for at least another material of the structure to which the material removal process is being applied. For example, in one embodiment, a selective etch can include an etch chemistry that removes a first material selectively to a second material by a ratio of 10:1 or greater, e.g., 100:1 or greater, or 1000:1 or greater.

Figure 7:
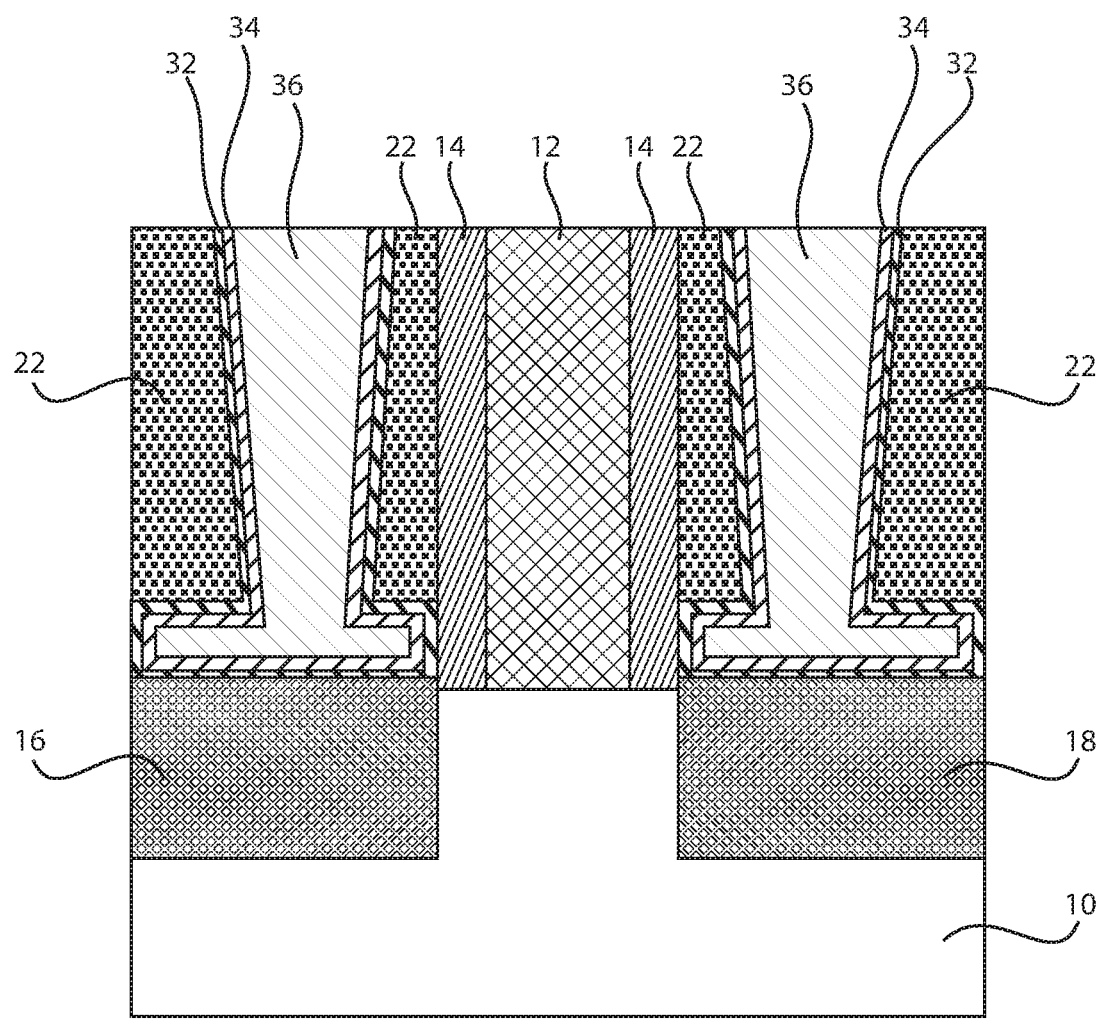
FIG. 7 is a cross-sectional view of the semiconductor device of FIG. 6 where at least one conducting material fills the trenches, in accordance with an embodiment of the present invention.

FIG. 7 is a cross-sectional view of the semiconductor device of FIG. 6 where at least one conducting material fills the trenches, in accordance with an embodiment of the present invention.

The conducting material can include metals, conducting metallic compounds, and conducting compounds that can be used to fill the trench to form source/drain 16, 18.

In implementations, after formation of the trench 26, layers of conducting material 32, 34, 36 are deposited onto the exposed portions of the structure. For example, a conventional sputtering process can be used to deposit the conducting material layers 32, 34, 36. Examples of sputtering apparatus that can be suitable for depositing a p-type work function metal layer include DC diode type systems, radio frequency (RF) sputtering, magnetron sputtering, and ionized metal plasma (IMP) sputtering. In addition to physical vapor deposition (PVD) techniques, the p-type work function metal layer can also be formed using chemical vapor deposition (CVD) and atomic layer deposition (ALD). Examples of sputtering apparatus that can be suitable for depositing an n-type work function metal layer include DC diode type systems, radio frequency (RF) sputtering, magnetron sputtering, and ionized metal plasma (IMP) sputtering. In one example, an n-type work function metal layer composed of TiN is sputtered from a solid titanium target, in which the nitrogen content of the metal nitride layer is introduced by a nitrogen gas. In another example, an n-type work function metal layer composed of TiN is sputtered from a solid target comprised of titanium and nitrogen. In addition to physical vapor deposition (PVD) techniques, the n-type work function metal layer can also be formed using chemical vapor deposition (CVD) and atomic layer deposition (ALD).

In one or more embodiments, the conducting material layers 32, 34 can have a thickness of about 10 nm to 50 nm, although other thicknesses can be employed. The first conducting material layer 32 can have a thickness approximately equal to the thickness of the second conducting material layer 34. The third conducting material layer 36 can have a thickness greater than the thickness of the first and second conducting material layers 32, 34. The first conducting material layer 32 can be, e.g., titanium (Ti). The second conducting material layer 34 can be, e.g., titanium nitride (TiN). The third conducting material layer 36 can be, e.g., Tungsten (W). The Ti layer 32 is the outer layer that contacts the entire surface of the source/drain 16, 18. In other words, the entire upper surface 17 of the source/drain 16, 18 is in direct contact with the Ti layer 32. By forming Ti along the entire surface of the source/drain 16, 18, low contact resistance is achieved. Stated differently, a contact conducting material, such as, e.g., Ti, is formed on the pristine epi source/drain surface. Therefore, the sacrificial layer 20, which can be, e.g., a Ge sacrificial layer, protects the source/drain 16, 18 (or the source/drain epitaxy) to acquire a new, pristine interface between a contact conducting material and the source/drain epitaxy to reduce contact resistance. The conducting material layers 32, 34, 36 can form, in unison, a substantially inverted T-shaped structure or contact to reduce the contact resistance.

According to aspects of the invention, the conducting materials that are deposited to form conducting material layers 32, 34, 36 are chosen based upon the type of device being created. For example, for PFET's where the doped (source/drain) regions 16, 18 comprise p-type semiconductor material, the conducting material layers 32, 34, 36 can comprise, e.g., Platinum (Pt) or Iridium (Ir). For NFET's where the doped (source/drain) regions 16, 18 comprise n-type semiconductor material, the conducting material layers 32, 34, 36 can comprise, e.g., Erbium (Er) or Ytterbium (Yb).

As noted above, a metal is one example of a conducting material. In one or more embodiments, the conducting material can be a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials.

Figure 8:
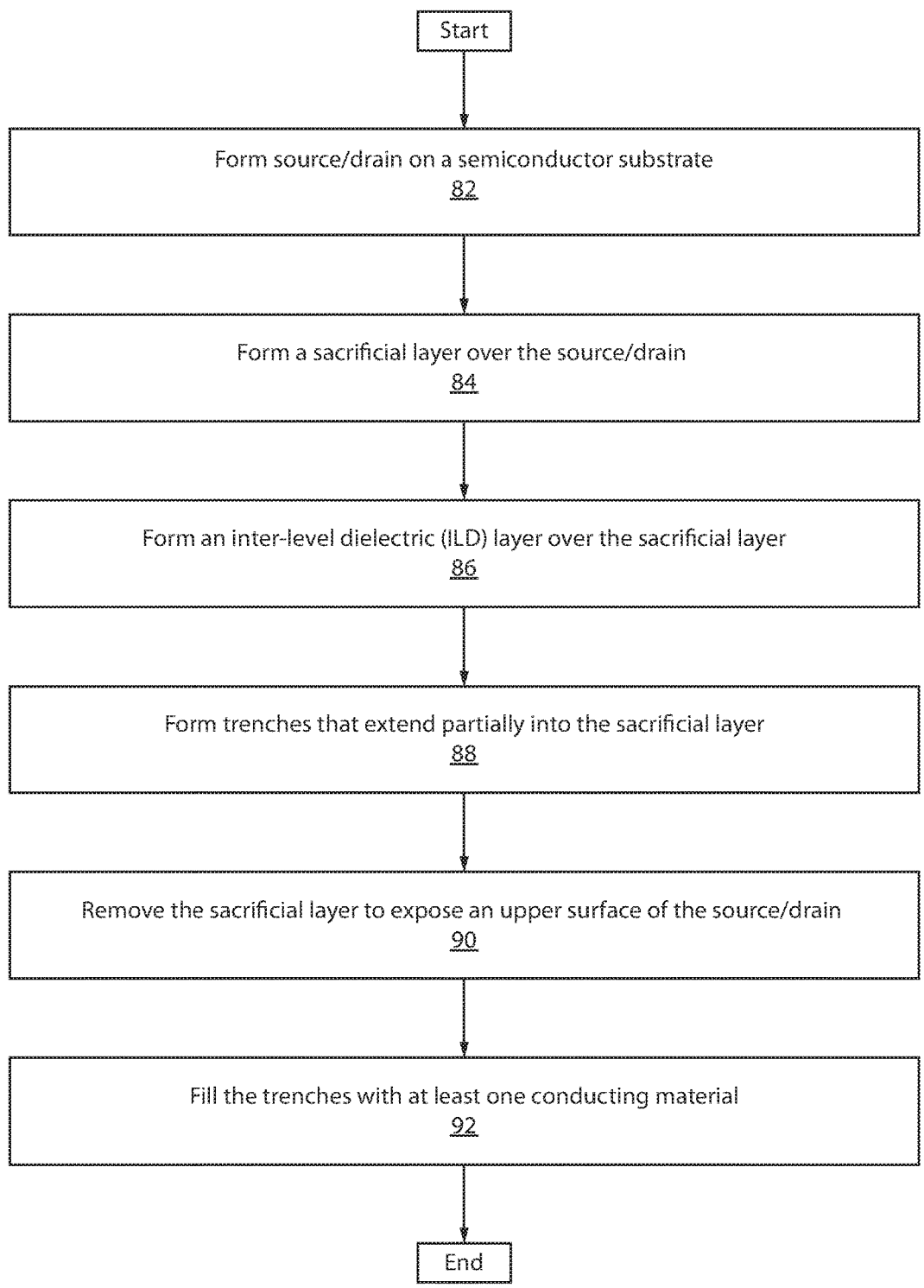
FIG. 8 is a block/flow diagram of an exemplary method for forming a semiconductor device by forming trenches that extend partially into a sacrificial layer that is removed to expose an upper surface of the source/drain and to fill the trenches with at least one conducting material, in accordance with an embodiment of the present invention.

FIG. 8 is a block/flow diagram of an exemplary method for forming a semiconductor device by forming trenches that extend partially into a sacrificial layer that is removed to expose an upper surface of the source/drain and to fill the trenches with at least one conducting material, in accordance with an embodiment of the present invention.

At block 82, source/drain are formed over a semiconductor substrate.

At block 84, a sacrificial layer is formed over the source/drain.

At block 86, an inter-level dielectric (ILD) layer is formed over the sacrificial layer.

At block 88, trenches are formed that extend partially into the sacrificial layer.

At block 90, the sacrificial layer is removed to expose an upper surface of the source/drain.

At block 92, the trenches are filled with at least one conducting material. In one example, the trenches are filled with three conducting material. The first conducting material contacts the inner surface of the ILD and the top surface of the source/drain. The second conducting material contacts the first conducting material, such that the second conducting material overlaps or circumferentially engages the first conducting material. The third conducting material is then deposited within the second conducting material. The surface area of the third conducting material is greater than the surface area of the first conducting material and the second conducting material. The third conducting material covers or fills most of the inverted T-shaped region created by the trenches and the gap region.

Therefore, in one or more embodiments, the surface area of contact is effectively increased (between the source/drain and the conducting materials). These aspects all contribute to a significant reduction in contact resistance over conventional schemes. This further enables scaling of the size of the technology without contact resistance acting as a bottleneck.

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements may be included in the compound and still function in accordance with the present embodiments. The compounds with additional elements will be referred to herein as alloys.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, may be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein may be interpreted accordingly. In addition, it will also be understood that when a layer is referred to as being "between" two layers, it can be the only layer between the two layers, or one or more intervening layers may also be present.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present concept.

Having described preferred embodiments of a method of device fabrication and a semiconductor device thereby fabricated (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

What is claimed is:

1. A semiconductor device, comprising:
   source/drain defining a rightmost point and a leftmost point, and formed over a semiconductor substrate;
   an inter-level dielectric (ILD) layer formed over the source/drain; and
   a first portion of trenches that extend through the ILD layer at a non-perpendicular angle with respect to the semiconductor substrate;
   a second portion of the trenches that extends laterally beyond sidewalls of the first portion of the trenches; and
   a plurality of conducting materials disposed within the trenches and extending laterally from the rightmost point to the leftmost point of an upper surface of the source/drain,
   wherein sidewalls of the ILD layer are aligned with vertical sidewalls of the second portion of the trenches and vertical sidewalls of the source/drain.

2. The device of claim 1, wherein a gate structure is formed on the semiconductor substrate.

3. The device of claim 2, wherein spacers are formed adjacent the gate structure.

4. The device of claim 3, wherein the trenches run transversely to a longitudinal axis of the gate structure.

5. The device of claim 1, wherein one of the plurality of conducting materials contacts an entire inner surface of the ILD layer.

6. The device of claim 1, wherein the plurality of conducting materials are three conducting materials.

7. The device of claim 6, wherein the first conducting material is titanium (Ti), the second conducting material is titanium nitride (TiN), and the third conducting material is Tungsten (W).

8. The device of claim 7, wherein the first conducting material contacts the source/drain.

\* \* \* \* \*